(12) United States Patent
Jeong

(10) Patent No.: US 8,324,643 B2
(45) Date of Patent: Dec. 4, 2012

(54) SEMICONDUCTOR LIGHT EMITTING DEVICE HAVING AN ISOLATION LAYER FORMED OF A CONDUCTIVE TRANSMISSIVE MATERIAL

(75) Inventor: Hwan Hee Jeong, Ulsan (KR)

(73) Assignee: LG Innotek Co., Ltd., Seoul (KR)

( * ) Notice: Subject to any disclaimer, the term of this patent is extended or adjusted under 35 U.S.C. 154(b) by 299 days.

(21) Appl. No.: 12/706,465

(22) Filed: Feb. 16, 2010

(65) Prior Publication Data

US 2010/0207128 A1  Aug. 19, 2010

(30) Foreign Application Priority Data

Feb. 17, 2009  (KR) .................. 10-2009-0013157

(51) Int. Cl.
*H01L 33/60* (2010.01)
(52) U.S. Cl. ............... 257/98; 257/E33.068; 372/50.11; 438/29
(58) Field of Classification Search ............... 372/50.11; 257/E33.068, 98; 438/29
See application file for complete search history.

(56) References Cited

U.S. PATENT DOCUMENTS

| 5,113,232 | A | 5/1992 | Itoh et al. |
| 6,903,381 | B2 | 6/2005 | Lin et al. |
| 2003/0164503 | A1* | 9/2003 | Chen ................................ 257/79 |
| 2004/0104390 | A1* | 6/2004 | Sano et al. ....................... 257/78 |
| 2007/0012937 | A1* | 1/2007 | Liu et al. .......................... 257/99 |
| 2007/0114552 | A1 | 5/2007 | Jang et al. |
| 2007/0290215 | A1 | 12/2007 | Kato et al. |
| 2008/0035949 | A1 | 2/2008 | Fudeta et al. |
| 2008/0113462 | A1 | 5/2008 | Kim et al. |
| 2009/0039367 | A1 | 2/2009 | Iso et al. |
| 2009/0039374 | A1 | 2/2009 | Yahata et al. |
| 2009/0146165 | A1* | 6/2009 | Hasnain et al. .................. 257/98 |
| 2009/0152583 | A1* | 6/2009 | Chen et al. ....................... 257/98 |
| 2010/0208763 | A1 | 8/2010 | Engl et al. |

FOREIGN PATENT DOCUMENTS

| DE | 10 2007 029 370 A1 | 11/2008 |
| KR | 10-2006-0059783 A | 6/2006 |
| KR | 10-0640496 B1 | 10/2006 |

* cited by examiner

*Primary Examiner* — Fernando L Toledo
*Assistant Examiner* — Peter Bradford
(74) *Attorney, Agent, or Firm* — Birch, Stewart, Kolasch & Birch, LLP (57) ABSTRACT

Disclosed is a semiconductor light emitting device. The semiconductor light emitting device includes a light emitting structure including a first conductive semiconductor layer, an active layer, and a second conductive semiconductor layer, a plurality of isolation layers formed along an outer peripheral portion of the light emitting structure below the light emitting structure, a metal layer interposed between the isolation layers, and a second electrode layer formed below the light emitting structure.

18 Claims, 9 Drawing Sheets

SEMICONDUCTOR LIGHT EMITTING DEVICE HAVING AN ISOLATION LAYER FORMED OF A CONDUCTIVE TRANSMISSIVE MATERIAL

CROSS-REFERENCE TO RELATED APPLICATIONS

The present application claims the benefit under 35 U.S.C. §119 of Korean Patent Application No. 10-2009-0013157, filed Feb. 17, 2009, which is hereby incorporated by reference in its entirety.

BACKGROUND

The embodiment relates to a semiconductor light emitting device and a method of manufacturing the same.

Group III-V nitride semiconductors are spotlighted as core materials of light emitting diodes (LEDs) or laser diodes (LDs) due to physical and chemical characteristics. For example, the group III-V nitride semiconductors include semiconductor materials having a composition formula of $In_xAl_yGa_{1-x-y}N$ ($0 \leq x \leq 1$, $0 \leq y \leq 1$, $0 \leq x+y \leq 1$).

The LED is a kind of a semiconductor device, which transmits signals by converting electricity into light using the characteristic of a compound semiconductor and is used as a light source.

The LED and LD employing such nitride semiconductors have been mainly used in light emitting devices to obtain light, and have been applied to various appliances (e.g., a light emitting part of a key pad of a portable phone, an electric bulletin board, an illumination device) as a light source.

SUMMARY

The embodiment provides a semiconductor light emitting device and a method of manufacturing the same, capable of preventing the loss of light efficiency from a lateral side of a light emitting structure.

The embodiment relates to a semiconductor light emitting device and a method of manufacturing the same, capable of preventing delamination and breaking by interposing a metal layer between isolation layers.

According to the embodiment, the semiconductor light emitting device includes a light emitting structure including a first conductive semiconductor layer, an active layer, and a second conductive semiconductor layer, a plurality of isolation layers formed along an outer peripheral portion of the light emitting structure below the light emitting structure, a metal layer interposed between the isolation layers, and a second electrode layer formed below the light emitting structure.

According to the embodiment, the semiconductor light emitting device includes a light emitting structure including a first conductive semiconductor layer, an active layer, and a second conductive semiconductor layer, a first isolation layer disposed along an outer peripheral portion of the light emitting structure below the light emitting structure, a metal layer disposed below the first isolation layer, a second isolation layer disposed below the metal layer, and a second electrode layer disposed below the second conductive semiconductor layer.

According to the embodiment, a method of manufacturing the semiconductor light emitting device is as follows. A light emitting structure including a first conductive semiconductor layer, an active layer, and a second conductive semiconductor layer is formed. A first isolation layer is formed along an outer peripheral portion of the light emitting structure. A metal layer is formed on the first isolation layer. A second isolation layer is formed on the metal layer. A second electrode layer is formed on the light emitting structure and the second isolation layer.

As described above, according to the embodiment, an adhesive strength can be improved between a light emitting structure and another layer.

According to the embodiment, light extraction efficiency of the semiconductor light emitting device can be improved, and delamination can be prevented.

DETAILED DESCRIPTION OF THE EMBODIMENTS

In the description of the embodiments, it will be understood that, when a layer (or film), a region, a pattern, or a structure is referred to as being "on" or "under" another substrate, another layer (or film), another region, another pad, or another pattern, it can be "directly" or "indirectly" on the other substrate, layer (or film), region, pad, or pattern, or one or more intervening layers may also be present. Such a position of the layer has been described with reference to the drawings.

In the description about the embodiment, the thickness or the size of elements shown in the accompanying drawings are for an illustrative purpose only, but the embodiment is not limited thereto.

Hereinafter, the embodiment will be described with respect to accompanying drawings.

Figure 1:
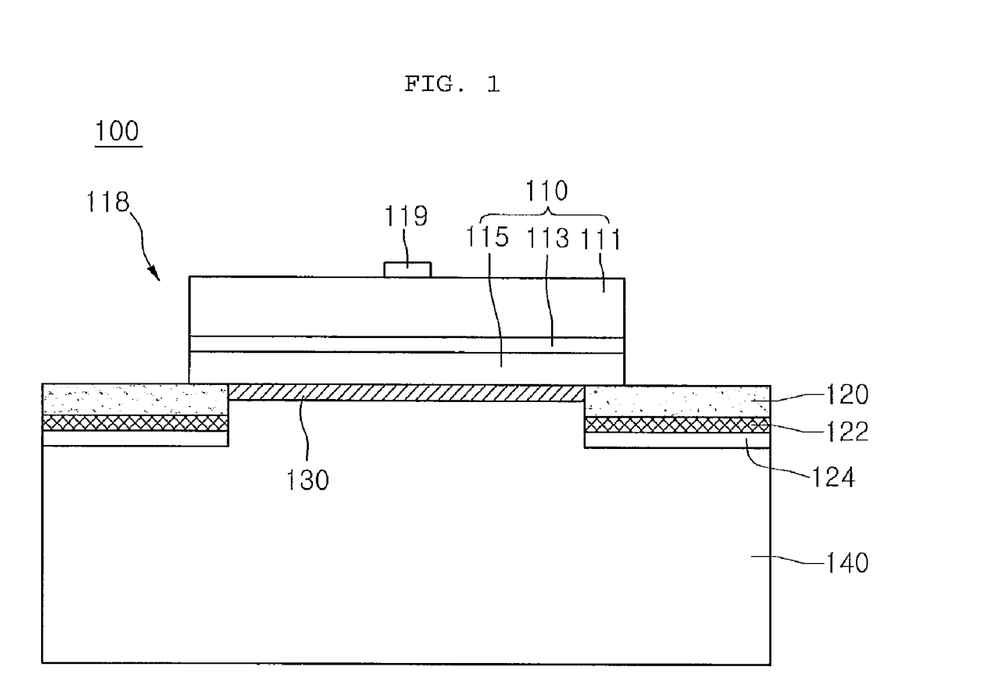
FIG. 1 is a sectional view showing a semiconductor light emitting device according to the embodiment.

FIG. 1 is a view showing a semiconductor light emitting device 100 according to the embodiment.

Referring to FIG. 1, the semiconductor light emitting device 100 according to the embodiment includes a light emitting structure 110, a first electrode layer 119, a first isolation layer 120, a metal layer 122, a second isolation layer 124, a second electrode layer 130, and a conductive support member 140.

The light emitting structure 110 includes a first conductive semiconductor layer 111, an active layer 113, and a second conductive semiconductor layer 115. The active layer 113 is interposed between the first and second conductive semiconductor layers 111 and 115.

The first conductive semiconductor layer 111 may be realized by using at least one semiconductor layer doped with first conductive dopants. For example, the first conductive semiconductor layer 111 may be realized by using a group III-V compound semiconductor. In other words, the first conductive semiconductor layer 111 may be formed of at least one of GaN, InN, AlN, InGaN, AlGaN, InAlGaN, and AlInN. If the first conductive semiconductor layer 111 is an N-type semiconductor layer, the first conductive dopant may be an N-type dopant. For example, the N-type dopant may be selected from among V-group elements.

The first conductive semiconductor layer 111 may be disposed thereon with the first electrode layer 119 having a predetermined pattern. In addition, concave-convex shape roughness may be formed on a portion of a top surface of the first conductive semiconductor layer 111 or the entire portion of the top surface of the first conductive semiconductor layer 111.

The active layer 113 is disposed below the first conductive semiconductor layer 111. The active layer 113 may have a single quantum well (SQW) structure or a multiple quantum well (MQW) structure. The active layer 113 may be formed at a cycle of a well layer and a barrier layer by using group III-V compound semiconductor materials. For example, the active layer 113 may be formed at a cycle of an InGaN well layer/ GaN barrier layer or an AlGaN well layer/GaN barrier layer.

The active layer 113 includes a material having a band-gap energy corresponding to the wavelength of light to be emitted. For example, if blue light having a wavelength in the range of 460 nm to 470 nm is emitted, the active layer 113 may be formed in the SQW structure or the MQW structure at a cycle of the InGaN well layer/GaN barrier layer. For example, the active layer 113 may be realized to emit light in a visible ray region having blue, red, and green wavelengths. In addition, the active layer 113 may be realized to emit light in an ultraviolet ray region.

A conductive clad layer may be disposed above and/or below the active layer 113. For example, the conductive clad layer may include an AlGaN layer.

The second conductive semiconductor layer 115 may be disposed below the active layer 113. The second conductive semiconductor layer 115 may be realized by using at least one semiconductor layer doped with second conductive dopants. For example, the second conductive semiconductor layer 115 may be realized by using a group III-V compound semiconductor. In other words, the second conductive semiconductor layer 115 may be formed of at least one of GaN, InN, AlN, InGaN, AlGaN, InAlGaN, and AlInN. If the second conductive semiconductor layer 115 is a P-type semiconductor layer, the second conductive dopant may be a P-type dopant. For example, the P-type dopant may be selected from among group III elements.

A third conductive semiconductor layer (not shown) may be additionally disposed below the second conductive semiconductor layer 115. If the conductive semiconductor layer 111 is a P-type semiconductor layer, the second conductive semiconductor layer 115 may be realized as an N-type semiconductor layer. The third conductive semiconductor layer may be realized as a semiconductor layer doped with P-type dopants. The light emitting structure 110 may include one of an N-P junction structure, a P-N junction structure, an N-P-N junction structure, and a P-N-P junction structure.

Hereinafter, for the purpose of explanation, description will be made regarding a case in which the second conductive semiconductor layer 115 is formed as the lowermost layer of the light emitting structure 110.

The first isolation layer 120 and the second electrode layer 130 are disposed below the second conductive semiconductor layer 115.

An inner portion of the first isolation layer 120 is formed along an outer peripheral portion of the second conductive semiconductor layer 115 below the second conductive semiconductor layer 115. An outer portion of the first isolation layer 120 extends outward below the second conductive semiconductor layer 115 and is exposed along an outer region 118 of the light emitting structure 110.

The first isolation layer 120 may be formed in the form of a frame by using a conductive transmissive material having light transmittance or an insulating material. The first isolation layer 120 is formed along a lower portion of the second conductive semiconductor layer 115.

The first isolation layer 120 may be formed of a conductive transmissive material such as ITO, IZO, IZTO, IAZO, IGZO, IGTO, AZO, or ATO. The first isolation layer 120 may include a metal oxide such as a transparent conductive oxide (TCO).

If the first isolation layer 120 includes a conductive transmissive material, the first isolation layer 120 transmits a laser beam irradiated in a mesa etching process. Accordingly, when the laser beam is irradiated, an outer portion of the light emitting structure 110 is not damaged, so that light emitting efficiency can be improved.

The first isolation layer 120 may be formed of an insulating material such as $SiO_2$, $SiO_x$, $SiO_xN_y$, $Si_3N_4$, $Al_2O_3$, or $TiO_2$. According to the embodiment, the first isolation layer 120 spaces the conductive support member 140 apart from the light emitting structure 110. The first isolation layer 120 can increase the adhesive strength with the second conductive semiconductor layer 115.

The metal layer 122 may be formed below the first isolation layer 120. The metal layer 122 may be formed of at least one layer made of metal having a high reflective index, in which the metal may be selected from the group consisting of Ag, Ni, Al, Rh, Pd, Ir, Ru, Mg, Zn, Pt, Au, Hf, and the combination thereof.

The second isolation layer 124 may be disposed below the metal layer 122. The second isolation layer 124 may be formed of at least one selected from the group consisting of ITO, IZO, IZTO, IAZO, IGZO, IGTO, AZO, ATO, $SiO_2$, $SiO_x$, $SiO_xN_y$, $Si_3N_4$, $Al_2O_3$, $TiO_2$. The first isolation layer 120 and the second isolation layer 124 may include the same material or different materials.

The first isolation layer 120 may be thicker than the second isolation layer 124. The first isolation layer 120 may be thicker than the second electrode layer 130. In addition, the first isolation layer 120, the metal layer 122, the second isolation layer 124, and the second electrode layer 130 may have various thicknesses and the relative thickness thereof may be changed. For example, the second isolation layer 124 may be thicker than the first isolation layer 120.

According to the embodiment, the first isolation layer 120, the metal layer 122, and the second isolation layer 124 may be formed in-situ by using one equipment. In addition, the metal layer 122 is interposed between the first and second isolation layers 120 and 124, so that an inter-layer adhesive strength can be improved, thereby preventing delamination.

The second electrode layer 130 may be disposed below the light emitting structure 110. In detail, the second electrode layer 130 may be disposed below an inner portion of the light emitting structure 110. The second electrode layer 130 may be formed of at least one layer made of at least one selected from the group consisting of Ag, Ni, Al, Rh, Pd, Ir, Ru, Mg, Zn, Pt, Au, Hf, and the combination thereof.

Since the second electrode layer 130 is not integrated with the metal layer 122, the second electrode layer 130 and the metal layer 122 can be prevented from interfering with each other due to thermal expansion.

An ohmic layer (not shown) may be formed between the second conductive semiconductor layer 115 and the second electrode layer 130. An ohmic layer (not shown) may be formed to have a predetermined pattern. The pattern of the ohmic layer may have the shape of a matrix, a cross, a polygon, or a circle. For example, the ohmic layer may be formed of ITO, IZO, IZTO, IAZO, IGZO, IGTO, AZO, or ATO. The ohmic layer may include a conductive oxide or metal. For example, the ohmic layer may be realized in a single layer structure or a multiple layer structure by using at least one of ITO, IZO, IZTO, IAZO, IGZO, IGTO, AZO, ATO, GZO, IrOx, RuOx, RuOx/ITO, Ni, Ag, Ni/IrOx/Au, and Ni/IrOx/Au/ITO.

The conductive support member 140 may be disposed below the second electrode layer 130. The conductive support member 140 is a base substrate. The conductive support member 140 may be realized by using Cu, Au, Ni, Mo, Cu—W, or a carrier wafer including a material such as Si, Ge, GaA, ZnO, SiC, GaN, SiGe, or $Ga_2O_3$. The conductive support member 140 may be realized by using a conductive sheet. The conductive support member 140 may be bonded or prepared as a plated layer. In addition, the conductive support member 140 may be attached as a conductive sheet.

FIGS. 2 to 9 are sectional views showing the manufacturing process of the semiconductor light emitting device according to the embodiment.

Figure 2:
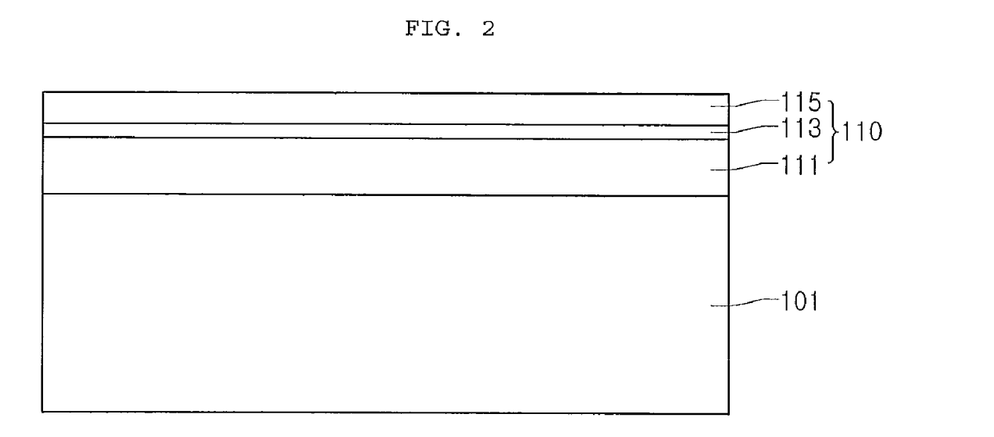
FIGS. 2 to 9 are sectional views sequentially showing the manufacturing process of the semiconductor light emitting device according to the embodiment.

Referring to FIG. 2, the first conductive semiconductor layer 111 is formed on a substrate 101. The active layer 113 is formed on the first conductive semiconductor layer 111, and the second conductive semiconductor layer 115 is formed on the active layer 113.

The substrate 101 may include one selected from the group consisting of $Al_2O_3$, GaN, SiC, ZnO, Si, GaP, InP, and GaAs. A predetermined concave-convex pattern may be formed on the substrate 101. The substrate 101 may be disposed thereon with another semiconductor layer such as a buffer layer and/or an undoped semiconductor layer, but the embodiment is not limited thereto.

The first semiconductor layer 111 may be realized as an N-type semiconductor layer. In this case, the second semiconductor layer 115 may be realized as a P-type semiconductor layer. In contrast, the first semiconductor layer 111 may be realized as a P-type semiconductor layer and the second semiconductor layer 115 may be realized as an N-type semiconductor layer.

An additional semiconductor layer such as a buffer layer and/or an undoped semiconductor layer may be formed between the substrate 101 and the first conductive semiconductor layer 111. After thin film growth, the additional layer may be separated or removed from the structure.

Figure 3:
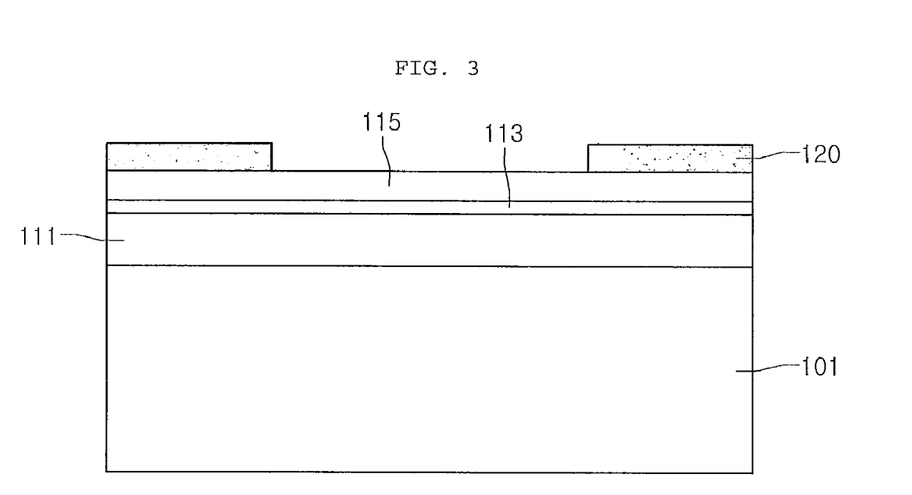

Referring to FIG. 3, the first isolation layer 120 is formed on an outer peripheral portion of the second conductive semiconductor layer 115. The first isolation layer 120 may be formed through a photolithography process. The first isolation layer 120 is formed in the form of a frame at the outer peripheral portion of the second conductive semiconductor layer 115. The first isolation layer 120 may be disposed in the form of a frame at an edge area of the second conductive semiconductor layer 115 in each chip.

The first isolation layer 120 may be formed of a material selected from ITO, IZO, IZTO, IAZO, IGZO, IGTO, AZO, ATO, $SiO_2$, $SiO_x$, $SiO_xN_y$, $Si_3N_4$, $Al_2O_3$, and $TiO_2$.

Figure 4:
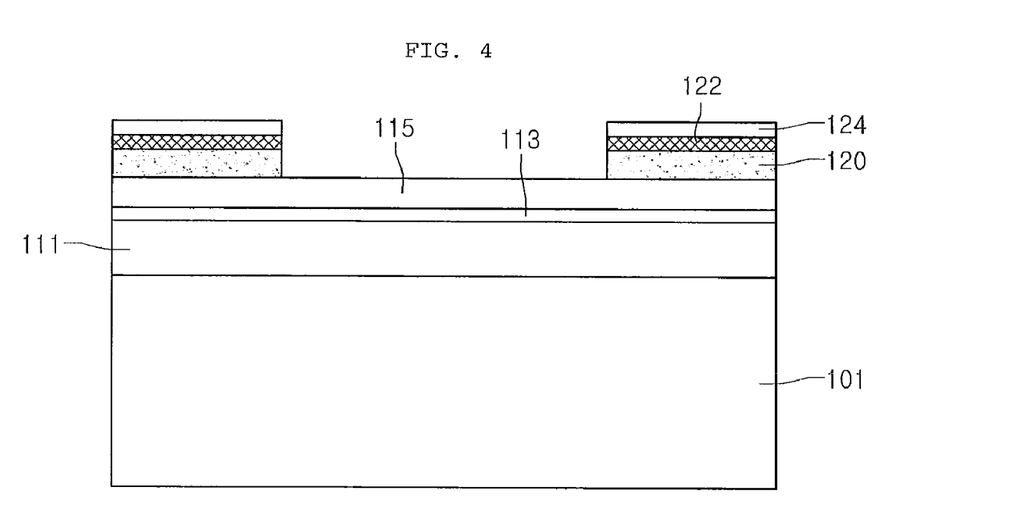

Referring to FIGS. 3 and 4, the metal layer 122 is formed on the first isolation layer 120, and the second isolation layer 124 is formed on the metal layer 122.

The first isolation layer 120, the metal layer 122, and the second isolation layer 124 are sequentially stacked on each other. In this case, the first isolation layer 120, the metal layer 122, and the second isolation layer 124 are sequentially formed through an in-situ process in the same chamber. The first isolation layer 120, the metal layer 122, and the second isolation layer 124 have a thickness of a few μms or a few tens of μms or less.

The metal layer 122 may be formed of at least one layer made of a material selected from the group consisting of Ag, Ni, Al, Rh, Pd, Ir, Ru, Mg, Zn, Pt, Au, Hf, and the combination thereof.

The metal layer 122 may be formed between a plurality of isolation layers 120 and 124. Accordingly, the first and second isolation layers 120 and 124 can reduce thermal expansion of the metal layer 122. Therefore, delamination can be prevented from occurring at an outer peripheral portion of a chip when a chip separating process is performed. In addition, the metal layer 122 is formed through an in-situ process while forming the first isolation layer 120, thereby improving an adhesive strength.

Figure 5:
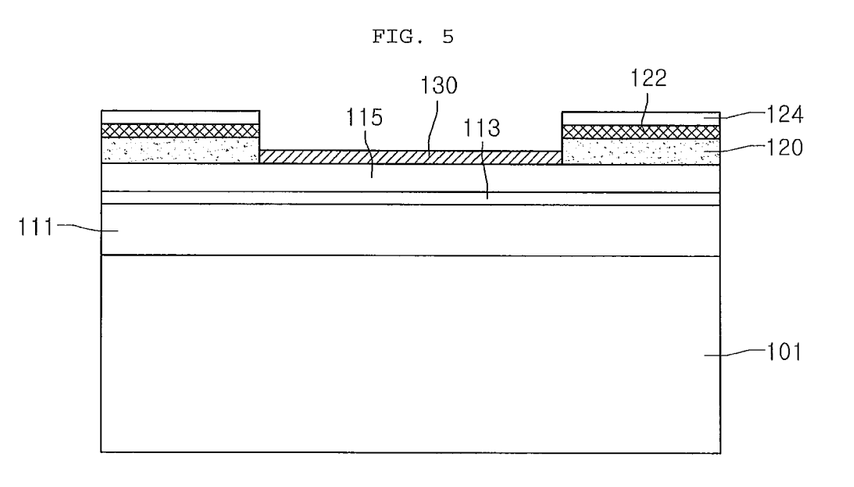
Figure 6:
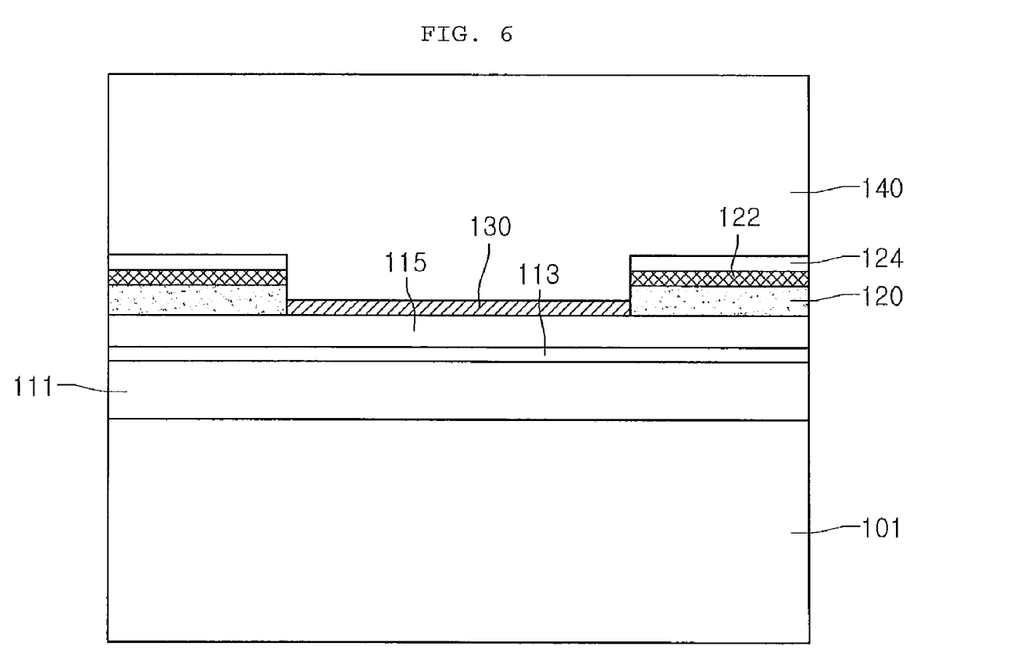

Referring to FIGS. 5 and 6, the second electrode layer 130 is formed on an inner portion of the second conductive semiconductor layer 115, and the conductive support member 140 is formed on the second electrode layer 130.

The second electrode layer 130 and the conductive support member 140 serve as a second electrode that is a conductive layer. An ohmic layer (not shown) having a predetermined pattern may be formed between the second conductive semiconductor layer 115 and the second electrode layer 130. The ohmic layer may be formed of ITO, IZO, IZTO, IAZO, IGZO, IGTO, AZO, or ATO. In other words, the ohmic layer may include a conductive oxide or metal. For example, the ohmic layer may be realized in a single layer structure or a multiple layer structure by using at least one of ITO, IZO, IZTO, IAZO, IGZO, IGTO, AZO, ATO, GZO, IrOx, RuOx, RuOx/ITO, Ni, Ag, Ni/IrOx/Au, and Ni/IrOx/Au/ITO.

The second electrode layer 130 may have a structure including at least one layer made of a material selected from the group consisting of Ag, Ni, Al, Rh, Pd, Ir, Ru, Mg, Zn, Pt, Au, Hf, and the combination thereof. The conductive support member 140 is a base substrate. The conductive support member 140 may be realized by using Cu, Au, Ni, Mo, Cu—W, or a carrier wafer including a material such as Si, Ge, GaA, ZnO, SiC, GaN, SiGe, or $Ga_2O_3$. The conductive support member 140 may be realized by using a conductive sheet. The conductive support member 140 may be bonded or prepared as a plated layer. In addition, the conductive support member 140 may be attached as a conductive sheet.

Figure 7:
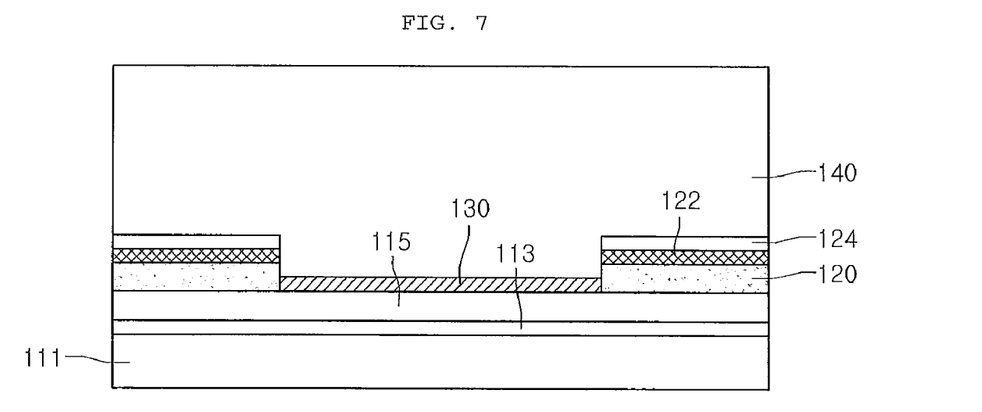

Referring to FIGS. 6 and 7, the substrate 101 is removed from the first conductive semiconductor layer 111. For example, the substrate 101 may be removed through a laser lift off (LLO) process. That is, a laser beam having a predetermined wavelength band is irradiated onto the substrate 101, so that thermal energy is concentrated onto the boundary between the substrate 101 and the first conductive semiconductor layer 111, thereby separating the substrate 101 from the first conductive semiconductor layer 111. The substrate 101 may be separated through another scheme. For example, when a different semiconductor layer such as a buffer layer is interposed between the substrate 101 and the first conductive semiconductor layer 111, wet etchant is injected into the buffer layer to remove the buffer layer, thereby separating the substrate 101 from the first conductive semiconductor layer 111.

After the substrate 101 has been removed, a bottom surface of the first conductive semiconductor layer 111 may be etched through an inductively coupled plasma/reactive ion etching (ICP/RIE) scheme.

Figure 8:
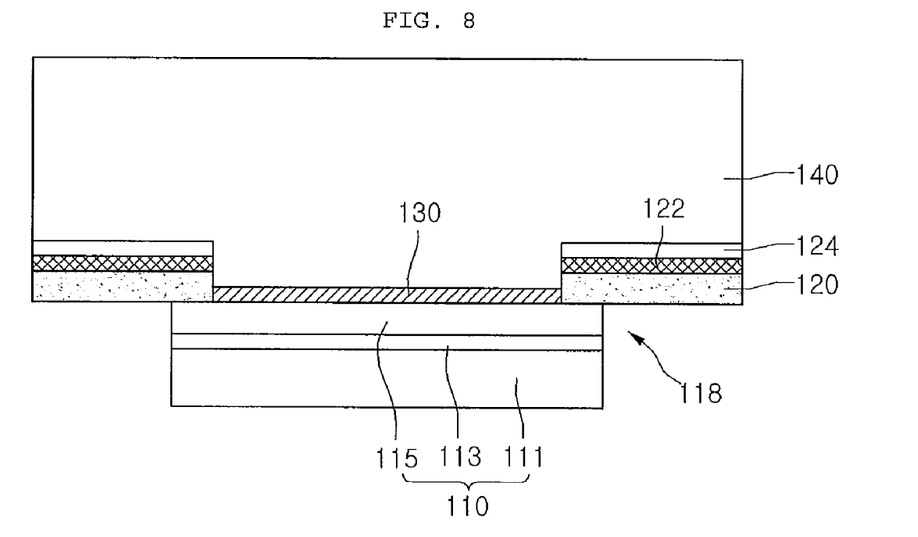

Referring to FIGS. 7 and 8, after the substrate 101 has been removed, the outer portion of a bottom surface of the first isolation layer 120 in the chip boundary region is exposed through a mesa etching scheme. The etching scheme may be performed through a dry and/or wet etch scheme.

The first and second isolation layers 120 and 124 can reduce thermal expansion of the metal layer 122 interposed therebetween. Accordingly, delamination can be prevented at the outer portion of a chip when a chip separating process is performed. As described above, since the metal layer 122 and the second isolation layer 124 are formed in-situ while forming the first isolation layer 120, inter-layer adhesive strength can be improved.

When the first isolation layer 120 includes a conductive material, a light efficiency can be improved due to the ohmic characteristic of the first isolation layer 120. In addition, the reflective efficiency of the metal layer 122 can be improved.

When the first isolation layer 120 includes an insulating material, the gap between the conductive support member 140 and the second conductive semiconductor layer 115 can be widened.

Figure 9:
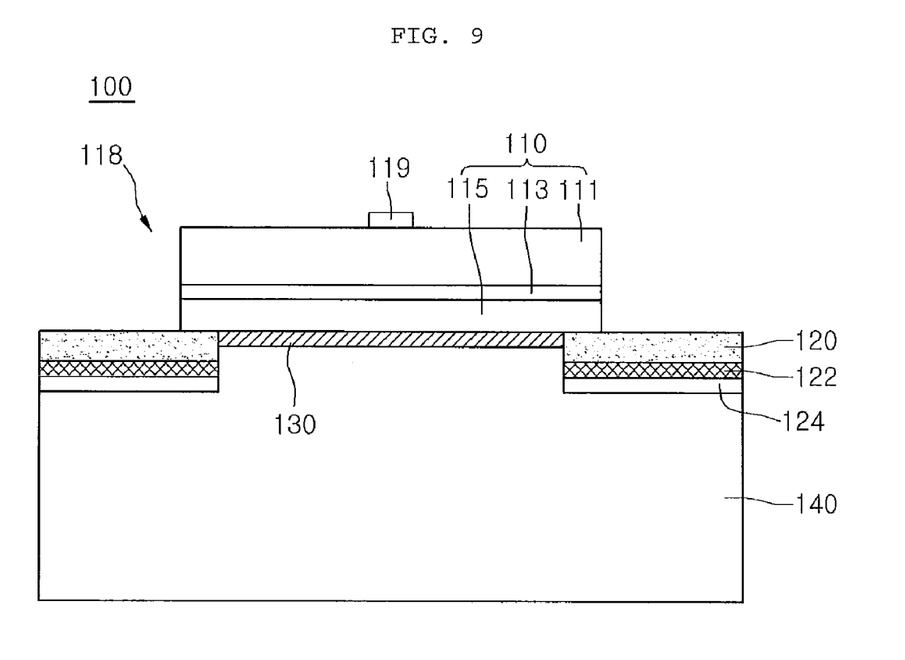

Referring to FIGS. 8 and 9, the first conductive semiconductor layer 111 may be formed thereon with the first electrode layer 119 having a predetermined pattern. Before or after the first electrode layer 119 has been formed, the dicing process is performed to provide individual chips.

In the semiconductor light emitting device 100 according to the embodiment, the first isolation layer 120 is exposed along the outer region 118 of the light emitting structure 110, and the metal layer 122 is interposed between the first and second isolation layers 120 and 124, thereby preventing delamination and improving reflective efficiency.

The semiconductor light emitting device according to the embodiments can be applied to various devices, such as a light emitting device package, a backlight unit, and an illumination device.

The light emitting device package may include a body, a first lead electrode, a second lead electrode, a semiconductor light emitting device according to the embodiments, and a molding member.

The first lead electrode and the second lead electrode may be disposed at the body. The semiconductor light-emitting device may be electrically connected to the first lead electrode and the second lead electrode. The molding member may be configured to mold the semiconductor light emitting device.

The body may be formed to include, for example, silicon material, synthetic resin, or metallic material, and an inclined surface may be formed around the semiconductor light emitting device. The first lead electrode and the second lead electrode may be electrically disconnected from each other, and may provide power to the semiconductor light emitting device. Also, the first lead electrode and the second lead electrode may reflect light emitted from the semiconductor light emitting device, thus increasing light efficiency. Also, the first lead electrode and the second lead electrode may serve to discharge heat generated by the semiconductor light emitting device.

The semiconductor light emitting device may be disposed on the body, or may be disposed on the first lead electrode or the second lead electrode. The semiconductor light emitting device may be electrically connected by, for example, a wire to the first lead electrode, and may be connected to the second lead electrode in, for example, a die-bonding configuration.

The molding member may mold the semiconductor light emitting device to protect the semiconductor light emitting device. Also, a fluorescent material may be included in the molding member to change a wavelength of light emitted from the semiconductor light emitting device.

The semiconductor light emitting device according to embodiments may be packaged in, for example, a semiconductor substrate, an insulating substrate, or a ceramic substrate (such as resin material or silicon).

The semiconductor light emitting device according to the embodiments can be applied to a backlight unit.

The backlight unit can be adapted to a display apparatus such as a liquid crystal display to supply light to the display apparatus. The backlight unit may include a light supply part, a light guide plate, and an optical sheet. The light emitting device package according to the embodiment can be adapted to the light supply part. The backlight unit may not employ the light guide plate.

The semiconductor light emitting device according to the embodiments can be applied to an illumination device.

The illumination device may include a case and a light supply module. The light supply module may be disposed in the case. The light emitting device package according to the embodiments can be adapted to the light supply module.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A semiconductor light emitting device, comprising:
a light emitting structure including a first conductive semiconductor layer, an active layer, and a second conductive semiconductor layer;
a first isolation layer disposed along an outer peripheral portion of the light emitting structure below the light emitting structure;
a metal layer disposed below the first isolation layer;
a second isolation layer disposed below the metal layer; and
a second electrode layer disposed below the second conductive semiconductor layer,
wherein the first isolation layer has
an inner portion, which is interposed between the outer peripheral portion of the light emitting structure and the metal layer, and
an outer portion exposed to an outside surface of the light emitting structure below the light emitting structure, and
wherein the first isolation layer is formed of a conductive transmissive material.

2. The semiconductor light emitting device of claim 1, wherein a lateral side of the inner portion of the first isolation layer is in contact with a lateral side of the second electrode layer with no portion of the first isolation layer under the second electrode layer.

3. The semiconductor light emitting device of claim 1, wherein the first isolation layer is thicker than the second electrode layer.

4. The semiconductor light emitting device of claim 1, wherein the first isolation layer is thicker than the second isolation layer.

5. The semiconductor light emitting device of claim 1, wherein the first isolation layer is thicker than the metal layer.

6. The semiconductor light emitting device of claim 1, wherein the first and second isolation layers are formed of at least one material independently selected from the group consisting of ITO, IZO, IZTO, IAZO, IGZO, IGTO, AZO, and ATO.

7. The semiconductor light emitting device of claim 1, wherein the metal layer is formed of at least one layer including a material selected from the group consisting of Ag, Ni, Al, Rh, Pd, Ir, Ru, Mg, Zn, Pt, Au, Hf, and combination thereof.

8. An illumination device comprising the semiconductor light emitting device of claim 1.

9. The semiconductor light emitting device of claim 1, wherein at least one of the first and second isolation layers is formed of at least one material selected from the group consisting of ITO, IZO, IZTO, IAZO, IGZO, IGTO, AZO, ATO, $SiO_2$, $SiO_x$, $SiO_xN_y$, $Si_3N_4$, $Al_2O_3$, and $TiO_2$.

10. The semiconductor light emitting device of claim 1, further comprising:
a conductive support member formed below the second electrode layer and the second isolation layer.

11. The semiconductor light emitting device of claim 10, wherein a portion of the conductive support member is in contact with a lower surface of the second electrode.

12. The semiconductor light emitting device of claim 1, further comprising:
a first electrode layer formed on the first conductive semiconductor layer.

13. The semiconductor light emitting device of claim 1, wherein the first isolation layer is formed of a material different from a material of the second isolation layer.

14. The semiconductor light emitting device of claim 1, wherein a portion of the first isolation layer is in contact with the light emitting structure.

15. The semiconductor light emitting device of claim 1, wherein the metal layer is not vertically overlapped with the second electrode layer.

16. The semiconductor light emitting device of claim 1, wherein the second isolation layer is not vertically overlapped with the second electrode layer.

17. The semiconductor light emitting device of claim 1, wherein the second isolation layer is not in contact with the second electrode layer.

18. A semiconductor light emitting device, comprising:
a light emitting structure including a first conductive semiconductor layer, an active layer, and a second conductive semiconductor layer;
a first isolation layer disposed along an outer peripheral portion of the light emitting structure below the light emitting structure;
a metal layer disposed below the first isolation layer;
a second isolation layer disposed below the metal layer; and
a second electrode layer disposed below the second conductive semiconductor layer and not in contact with the second isolation layer,
wherein a top surface of the first isolation layer is below a bottom surface of the light emitting structure, with an outer portion of the bottom surface of the light emitting structure in contact with an inner portion of the top surface of the first isolation layer, and with an outer portion of the top surface of the first isolation layer exposed to an outside surface of the light emitting structure,
wherein the second isolation layer is not in contact with the second electrode layer, and
wherein the first isolation layer is formed of a conductive transmissive material.

* * * * *